United States Patent
Gao et al.

(10) Patent No.: US 10,167,223 B2
(45) Date of Patent: Jan. 1, 2019

(54) PREPARATION METHOD OF DOPED VANADIUM DIOXIDE POWDER

(71) Applicant: SHANGHAI INSTITUTE OF CERAMICS, CHINESE ACADEMY OF SCIENCES, Shanghai (CN)

(72) Inventors: Yanfeng Gao, Shanghai (CN); Chuanxiang Cao, Shanghai (CN); Lei Dai, Shanghai (CN); Hongjie Luo, Shanghai (CN); Minoru Kanehira, Shanghai (CN)

(73) Assignee: SHANGHAI INSTITUTE OF CERAMICS, CHINESE ACADEMY OF SCIENCES, Shanghai (CN)

( * ) Notice: Subject to any disclaimer, the term of this patent is extended or adjusted under 35 U.S.C. 154(b) by 479 days.

(21) Appl. No.: 14/697,481

(22) Filed: Apr. 27, 2015

(65) Prior Publication Data

US 2015/0251948 A1 Sep. 10, 2015

Related U.S. Application Data (62) Division of application No. 13/980,862, filed as application No. PCT/CN2012/070025 on Jan. 4, 2012.

(30) Foreign Application Priority Data

Jan. 21, 2011 (CN) .......................... 2011 1 0024215
Jan. 21, 2011 (CN) .......................... 2011 1 0024229

(51) Int. Cl.
*C03C 3/12* (2006.01)
*C03C 4/08* (2006.01)
(Continued)

(52) U.S. Cl.
CPC .............. *C03C 3/122* (2013.01); *C01G 31/02* (2013.01); *C01G 39/00* (2013.01);
(Continued)

(58) Field of Classification Search
CPC ..... C03C 3/122; C03C 3/127; C03C 2204/00; C03C 4/082; C01G 49/0018; C01G 39/00;
(Continued)

(56) References Cited

U.S. PATENT DOCUMENTS 5,634,154 A * 5/1997 Sasagaki ................ G03B 17/18
                                                    396/291
5,637,545 A * 6/1997 Lewis ...................... B01J 23/34
                                                   423/594.12

(Continued)

FOREIGN PATENT DOCUMENTS

CN   1162949 A    10/1997
CN   1279211 A    1/2001

(Continued)

OTHER PUBLICATIONS

Machine Translation of Publ. No. CN 101265374 (A), published Sep. 2008, European patent Office, obtained online @ http://ep.espacenet.com/ (Downloaded Apr. 5, 2017), 12 pages.*

(Continued)

*Primary Examiner* — Daniel S Metzmaier
(74) *Attorney, Agent, or Firm* — Alleman Hall Creasman & Tuttle LLP (57) ABSTRACT

The present invention relates to a hydrothermal method for preparing a doped vanadium dioxide powder, the doped powder having a chemical composition of $V_{1-x}M_xO_2$, $0<X\leq0.5$, and M is a doping element, which is introduced to control a particle size and a morphology of the doped powder, the doping element M is selected from a group
(Continued)

consisting of manganese, iron, cobalt, nickel, copper, zinc, tin, indium, antimony, gallium, germanium, lead and bismuth, the method comprising a step of a precursor treatment of titrating a quadrivalent vanadium aqueous solution with a basic reagent to obtain a precursor suspension, wherein the precursor treatment involves titrating the quadrivalent vanadium aqueous solution until the emergence of the precursor suspension. The preparation methods for the present invention are easy to implement, low in cost, provide high yield, and are suitable for large scale production.

10 Claims, 7 Drawing Sheets

(51) Int. Cl.
| | | |
|---|---|---|
| *C01G 31/02* | (2006.01) | |
| *C01G 39/00* | (2006.01) | |
| *C01G 49/00* | (2006.01) | |
| *B82Y 30/00* | (2011.01) | |
| *B82Y 40/00* | (2011.01) | |

(52) U.S. Cl.
CPC .......... *C01G 49/0018* (2013.01); *C03C 3/127* (2013.01); *C03C 4/082* (2013.01); *B82Y 30/00* (2013.01); *B82Y 40/00* (2013.01); *C01P 2002/52* (2013.01); *C01P 2002/54* (2013.01); *C01P 2002/72* (2013.01); *C01P 2004/04* (2013.01); *C01P 2004/10* (2013.01); *C01P 2004/64* (2013.01); *C03C 2204/00* (2013.01); *Y10T 428/2982* (2015.01)

(58) Field of Classification Search
CPC .. C01G 31/02; C01P 2004/64; C01P 2004/04; C01P 2004/10; Y10T 428/2982; B82Y 30/00; B82Y 40/00
USPC .................. 428/402; 423/492, 594.8; 516/88
See application file for complete search history.

(56) References Cited

U.S. PATENT DOCUMENTS

| | | | | |
|---|---|---|---|---|
| 6,358,307 | B1* | 3/2002 | Legrand | C01G 31/00 106/479 |
| 9,650,520 | B2* | 5/2017 | Luo | C09D 5/028 |
| 2002/0009642 | A1* | 1/2002 | Funabiki | C01G 49/00 429/221 |
| 2011/0095242 | A1* | 4/2011 | Jin | B01J 23/22 252/583 |
| 2011/0284809 | A1* | 11/2011 | Jin | C09D 5/26 252/583 |

FOREIGN PATENT DOCUMENTS

| | | |
|---|---|---|
| CN | 1693211 A | 11/2005 |
| CN | 1837061 A | 9/2006 |
| CN | 101265374 A | 9/2008 |
| CN | 101391814 A | 3/2009 |
| CN | 101700909 A | 5/2010 |
| CN | 101760735 A | 6/2010 |
| CN | 101863511 A | 10/2010 |
| CN | 101920995 A | 12/2010 |
| CN | 102120614 A | 7/2011 |
| CN | 102120615 A | 7/2011 |
| GB | 1328954 A | 1/1971 |
| JP | 2011178825 A | 9/2011 |
| KR | 20030043403 A | 6/2003 |
| NL | 7015141 A | 7/1971 |
| WO | 2010001669 A1 | 1/2010 |

OTHER PUBLICATIONS

Machine Translation of Publ. No. CN 1837061 (A), published Sep. 2006, European patent Office, obtained online @ http://ep.espacenet.com/ (Downloaded Apr. 5, 2017), 10 pages.*
Machine Translation of Publ. No. CN 101391814 (A), published Mar. 2009, European patent Office, obtained online @ http://ep.espacenet.com/ (Downloaded Apr. 5, 2017), 6 pages.*
Machine Translation of Publ. No. CN 101760735 (A), published Jun. 2010, European patent Office, obtained online @ http://ep.espacenet.com/ (Downloaded Jun. 23, 2017), 30 pages.*
Oka, Y. et al., "Powder X-Ray Crystal Structure of VO2(A)," Journal of Solid State Chemistry, vol. 86, No. 1, May 1990, 9 pages.
Luo, M. et al., "Synthesis of VO2 Nanocrystalline via Hydrothermal Method," Key Engineering Materials, vol. 336-338, Apr. 2007, 4 pages.
Ji, S. et al., "Synthesis and Phase Transition Behavior of W-Doped VO2(A) Nanorods," Journal of the Ceramic Society of Japan, vol. 118, No. 1382, Oct. 2010, 5 pages.
ISA State Intellectual Property Office of the People's Republic of China, International Search Report Issued in Application No. PCT/CN2012/070025, Apr. 12, 2012, WIPO, 4 pages.

* cited by examiner

FIG. 1

PRIOR ART

FIG. 2

PRIOR ART

PREPARATION METHOD OF DOPED VANADIUM DIOXIDE POWDER

CROSS-REFERENCE TO RELATED APPLICATION

The present application is a divisional of U.S. patent application Ser. No. 13/980,862 filed Jul. 19, 2013, entitled "Application and Synthesis of Doped Vanadium Dioxide Powder and Dispersing Agent," which is the national phase of PCT/CN2012/070025 filed Jan. 4, 2012, entitled "Doped Vanadium Dioxide Power, Dispersion, and Preparation Methods and Applications therefor," which in turn claims priority to CN201110024229.5 filed Jan. 21, 2011 and CN201110024215.3 filed Jan. 21, 2011.

TECHNICAL FIELD

This invention involves the synthesis of $VO_2$ powder, especially doped $VO_2$ powder and its application.

BACKGROUND

Due to the worldwide growing energy crisis, energy conservation and emission reduction are more important today than ever before. In December of 2009, United Nations Environment Programme reported that building energy consumption occupies about one third of global greenhouse gas emissions. In China, building energy consumption overall accounts for 30% of the total available primary energy. In particular, energy exchange through windows accounts for over 50% of energy consumed through a building's envelope by means of conduction, convection and radiation. To reduce energy consumption, it is necessary to develop smart windows which are designed to intelligently control the amount of transmitted light and heat (mainly in the near infrared region) in response to an external stimulus.

At present low emissivity glass which has high visible transmittance and high infrared reflection is prevalent in the energy saving glass market and can greatly reduce heat transfer from indoors to outdoors compared to the ordinary glass and traditional building coating glass. However, low emissivity glass is expensive and not intelligent enough. Therefore, there is urgency to develop the next generation of smart windows with independent intellectual property rights.

Vanadium dioxide ($VO_2$) with a Mott-phase transition is a key material for application to thermochromic smart windows because it exhibits a reversible transformation from an infrared-transparent semiconductive state at low temperatures to an infrared-transparent semiconductive state at high temperatures, while maintaining visible transmittance.

Various techniques including the sol-gel method, chemical vapor deposition, sputtering deposition, pulsed-laser deposition, and ion implantation have been utilized to deposit $VO_2$ films, however many problems exist, such as expensive equipment, complex control processes, poor stability, low deposition rate and unsuitable mass production. In addition, the application of smart windows with $VO_2$ films is restricted because it can only be applied to new glass. Therefore, on the basis of energy saving reconstruction, $VO_2$ powders with intelligent energy-saving effect are preferably coated on existing ordinary glass.

The vanadium-oxygen phase diagram shows nearly 15-20 other stable vanadium oxide phases besides $VO_2$, such as VO, $V_6O_{13}$ and $V_7O_{13}$. The formation of $VO_2$ occurs only over a very narrow range of oxygen partial pressures. Additionally, more than ten kinds of crystalline phases of vanadium dioxide have been reported, including tetragonal rutile-type $VO_2$ (R), monoclinic rutile-type $VO_2$ (M), triclinic $VO_2$ (P*(2)), tetragonal $VO_2$ (A), monoclinic $VO_2$ (B), $VO_2$ (C), orthorhombic $VO_2.H_2O$, tetragonal $VO_2.0.5H_2O$, monoclinic $V_2O_4$ and $V_2O_4.2H_2O$. Only the rutile-type $VO_2$ (R/M) undergoes a fully reversible metal-semiconductor phase transition (MST) at approximately 68° C. However, the preparation of $VO_2$ (M/R) powder has become a technical difficulty for the application of smart windows.

High temperature sintering was usually used to fabricate $VO_2$ powder. A method to fabricate vanadium dioxide powder doped with tungsten, in which $VO_2$ (B) powder is first synthesized and then heat treated at 350~800° C. to attain $VO_2$ (R) powder is issued in patent (CN10164900). Moreover, many methods including spray pyrolysis (U.S. Pat. No. 5,427,763), thermal cracking (CN1321067C), sol-gel (U.S. Pat. No. 6,682,596) and reverse microemulsion (WO2008/011198 A2) have been used to synthesize $VO_2$ powder. A patent (CN101391814) from our research group describes one-step hydrothermal synthesis of $VO_2$ (M/R) powders.

SUMMARY

The preparation of composite film with $VO_2$ powder and other material was simple and beneficial for mass production, and could be used not only for energy conservation reconstruction of existing glass, but also for coating different substrates, thus expanding the application of $VO_2$. However, for preparation of thin films and coatings of $VO_2$, the morphology and particle size of $VO_2$ powder met special requirements that allowed $VO_2$ powder to possess excellent dispersibility.

However, the doped $VO_2$ powder usually had a large size (more than 100 nm) and rod shape (aspect ratio more than 10), and furthermore doping elements couldn't control the crystalline phase, and doped $VO_2$ powder possessed poor dispersibility and were unsuitable for preparation of $VO_2$ thin films and coatings.

Although a patent (CN101164900A) demonstrated that the size of $VO_2$ powder doped with tungsten was smaller than 50 nm, it was not involved in the microstructure of the powder, suggesting that the doped tungsten element didn't modulate the aspect ratio of $VO_2$ powders. Moreover, it was difficult to control the crystalline phase by means of high temperature sintering from $VO_2$(B) to $VO_2$(R) powder. A patent (CN101391814A) from our research group indicated the shape of $VO_2$ powder was granular, however it wasn't related to the size and aspect ratio of $VO_2$ powder. According to FIG. 2, the grain was actually rod-shaped rather than granular.

The doping of $VO_2$ powder focused on the effect on the phase transition temperature of $VO_2$, and tungsten and molybdenum are usually used as doping elements. But it pays no attention to the influence on the grain size and morphology. Furthermore, there is no discussion about regulation of the grain size and morphology of $VO_2$ by doping.

A patent illustrated the method to fabricate $VO_2$ with small size, however $VO_2$(M) was synthesized through induction on the surface of $TiO_2$, meaning that $VO_2/TiO_2$ composite particles were attained, rather than doped $VO_2$ particles with single chemical composition.

$VO_2$ powder which could be controllable and have excellent dispersibility was beneficial. On the one hand, the present invention provides one approach to preparation of doped $V_{1-x}M_xO_2$ powder (M is a doping element and x lies between 0 and 0.5. When $0.03<x\leq0.3$, it is preferred. If $0.03<x\leq0.1$ or $0.005<x\leq0.025$, it is more preferred), on the other hand, this doping method can control the size and morphology of $VO_2$ powders.

In this invention, through doping with certain elements, small and uniform $VO_2$ powder was attained, and the doped $VO_2$ powder possessed stable crystalline phase and good dispersibility in water and dispersing agent (such as polyvinyl pyrrolidone) so that it was easily used to coat the glass substrate and suitable for preparation of films and coatings of $VO_2$.

Certain elements could be transition metal elements with atomic number between 21 and 30, tin and its nearby elements such as In, Sb, Sn, Ga, Ge, Pb and Bi. These transition metal elements included Sc, Ti, Cr, Mn, Fe, Co, Ni, Cu and Zn. The preferred elements were Bi, Sn, Fe, Zn and Ti.

The above doping elements could not only change phase transition temperature of $VO_2$, but also regulate the size and morphology of $VO_2$ powder, and they were different from previous doping elements which only adjust phase transition temperature.

In this invention, the doped $VO_2$ powder was granular and possessed the aspect ratio between 1 and 10. The preferred aspect ratio was 1~5 and the more preferred aspect ratio was 1~2. The particle size of $VO_2$ in at least one dimension was less than 1 μm and if it was not more than 100 nm, it was an preferred size. The more preferred particle size was not more than 100 nm in three dimensions and the most preferred size was less than 70 nm in three dimensions. The particle could be various shapes such as nearly sphere, ellipse, snowflakes, cube, tablet and so on.

$VO_2$ powder with the above size and morphology had better dispersibility.

The doped $VO_2$ powder contained rutile phase $VO_2$ and the proportion of $VO_2(R)$ could be as high as 80%, even 100%. The doped $VO_2$ powder had controllable size and morphology and possessed a semiconductor-metal phase transition, whose phase transition temperature was continuously adjusted between −30 and 90° C.

Due to extensive application of $VO_2$ powder, it is urgent to develop a simple and low-cost synthesis of $VO_2$ powder. It was found that processing a reaction precursor lessened the difficulty of hydrothermal reaction of $VO_2$. This invention provided a method to fabricate doped $VO_2$ powder, in which the $V^{4+}$ ion aqueous solution was treated with a basic reagent and then attained a suspension precursor.

Before doping certain elements, the $V^{4+}$ ion aqueous solution precursor was treated with basic reagent and we obtained $VO_2$ powder with controllable size and morphology. The particle size was less than 1 μm in at least one dimension and the particle aspect ratio wasn't more than 10. Small and uniform $VO_2$ powder was attained, and the doped $VO_2$ powder possessed a stable crystalline phase and good dispersibility in water and dispersing agent (such as polyvinyl pyrrolidone) so that it was easy to coat in the glass substrate and suitable for preparation of films and coatings of $VO_2$.

In sum, this method had many advantages including simple operation, low cost, easy control, excellent crystallinity and suitable scale production.

In this invention, the molar ratio of the basic reagent and $V^{4+}$ ion aqueous solution was 0.02~10. The preferred ratio was 0.1~5 and the more preferred ratio was 0.2~2. The precursor was treated by means of a titration method in which we used the basic reagent to titrate the $V^{4+}$ ion aqueous solution until the suspension precursor was attained. The pH at the end of the titration was 2~12 and the preferred pH was 5~10. This method was easy to operate and control, and performed without special equipment.

The concentration of $V^{4+}$ ion aqueous solution was between 0.005 and 0.5 mol/L, usually chosen to be 0.01 mol/L. The $V^{4+}$ ion aqueous solution was attained through dissolving soluble vanadium raw material in deionized water. Commonly used soluble vanadium raw material could be trivalent, quadrivalent or pentavalent vanadium salts and their hydrates, and quadrivalent vanadium salts and their hydrates such as $VOSO_4$, $VOCl_2$ and $VOC_2O_4.5H_2O$ are preferred. When trivalent and pentavalent soluble vanadium salts and their hydrates were employed as starting materials, $V^{4+}$ ion aqueous solution was attained through oxidation and reduction pretreatment respectively; at the same time, the quadrivalent vanadium salts were obtained via oxidation and reduction pretreatment respectively and then dissolved in deionized water. Moreover, for insoluble vanadium raw material such as metal vanadium, vanadium oxide or their combination, $V^{4+}$ ion aqueous solution was prepared via oxidation, reduction or solvation pretreatment.

Alkaline reagents such as ammonia, sodium hydroxide, potassium hydroxide, soda ash, sodium bicarbonate, potassium carbonate solution, potassium bicarbonate and the arbitrary combination could be used. Ammonia, sodium hydroxide and potassium hydroxide were preferred choices and the more preferred choice was sodium hydroxide. The basic reagent concentration could be 0.5~5 mol/L and the preferred concentration was 0.5~2 mol/L.

The attained suspension solution via alkali treatment could be mixed with certain doping agents, and then doped $VO_2$ powder was fabricated through a hydrothermal reaction. The mole ratio of doping elements and $V^{4+}$ ion aqueous solution could be 0.001~1; preferred mole ratios were 0.03~0.43 mol/L and 0.005~0.026 and the more preferred mole ratio was 0.03~0.11. The temperature of the hydrothermal reaction could be 200~400° C.; preferred temperature was 200~350° C. and the more preferred temperature was 250~300° C. The time of the hydrothermal reaction was 1~240 h; preferred time was 2~120 h and the more preferred time was 4~60 h. The filling ratio of the hydrothermal reaction was 20~90%; preferred filling ratio was 30~80% and the more preferred filling ratio was 50~80%.

Before hydrothermal reaction, the $V^{4+}$ ion aqueous solution precursor was treated with basic reagent, and then the reaction became one-step reaction with low reaction temperature and high production. $VO_2$ powder with controllable size and morphology was attained. This method had many advantages including simple operation, low cost, easy control and excellent crystallinity.

The dispersing agent of $VO_2$ powder was provided in this invention and the concentration of $VO_2$ powder could be 100 g/L; preferred concentration was 1~50 g/L and the more preferred concentration was 5~30 g/L.

The above dispersing agent could be coated in suitable matrix and used in the thermochromic film, energy-saving paint, intelligent energy-saving glass curtain wall, temperature control device (such as solar temperature control device) and energy-saving coating. For example, this agent is suitable for direct manufacturing energy-saving glass and could also be used to transform existing common glass, and even used in surface energy-saving reconstruction of buildings, and transportation. What's more, this $VO_2$ powder could be used in energy information equipment including micro photoelectric switches, thermistors, battery materials and optical information storage devices.

Energy-saving film was prepared with doped $VO_2$ powder and possessed many advantages such as a simple process, low cost, wide application and excellent spectral characteristics.

DETAILED DESCRIPTION OF THE EMBODIMENTS

According to the following figures, the implementation method of this invention is explained in detail.

First, the hydrothermal reaction to fabricate doped $VO_2$ (R) powder was taken for example. Furthermore, this method could be used to prepare undoped $VO_2(R)$ powder and other crystalline phase of $VO_2$ powder such as $VO_2(A)$ powder.

The $V^{4+}$ ion aqueous solution acted as a reaction precursor and was treated with a basic reagent.

The $V^{4+}$ ion aqueous solution was prepared through commonly used methods. The quadrivalent soluble vanadium salt and its hydrate such as $VOSO_4$, $VOCl_2$ and $VOC_2O_4.5H_2O$ was dissolved in a suitable amount of deionized water and the proper concentration could be 0.005~0.5 mol/L, usually 0.01 mol/L. The $V^{4+}$ ion aqueous solution was prepared at room temperature, but slightly heating or ultrasonic processing could help the dissolution.

When trivalent and pentavalent soluble vanadium salts and their hydrates were employed as starting materials, they were dissolved in deionized water, and then $V^{4+}$ ion aqueous solution was attained through oxidation and reduction pretreatment respectively; at the same time, the quadrivalent vanadium salts were obtained via oxidation and reduction pretreatment respectively and then dissolved in deionized water. If insoluble precipitate appeared in the redox process, it could be dissolved through slightly heating or adding the right amount of deionized water.

$V^{4+}$ ions aqueous solution can be prepared by using insoluble vanadium material as raw materials, such as vanadium, vanadium oxide or a combination of vanadium oxide. These materials can be dissolved in water to form $V^{4+}$ ions aqueous solution by oxidation, reduction or other pretreatment.

The configured $V^{4+}$ aqueous solution was titrated with alkaline reagent until the suspension was generated. Ammonia, sodium hydroxide aqueous solution, potassium hydroxide solution, aqueous sodium carbonate, sodium bicarbonate aqueous solution, aqueous potassium carbonate, potassium bicarbonate aqueous solution, or any combination thereof may be used as the alkaline reagent for titration. Aqueous ammonia, aqueous sodium hydroxide, and aqueous potassium hydroxide solutions were preferable and aqueous sodium hydroxide solution was more preferable. Through a great deal of experiments, the inventor found that it was conducive to the formation of the suspension to determine the titration end point by controlling the concentration of the alkaline reagent and $V^{4+}$ ions in aqueous solution, wherein the favorable concentration of alkaline agent was 0.5 to 2 mol/L. When the titration was finished, the pH value of the suspension was usually from 2 to 12, the molar ratio of alkaline reagent and $V^{4+}$ ions in the aqueous solution is usually from 1:50 to 10:1, and the minimum amount of alkaline reagent should be capable of forming a suspension. Therefore, the preferred molar ratio of alkaline reagent and $V^{4+}$ ions in aqueous solution was greater than 1:10, and more preferably from 1:5 to 2:1. However, it should be understood that the alkaline agent was not excessive, and the molar ratio of alkaline reagent and $V^{4+}$ ions in aqueous also preferably did not exceed 5:1. It was easy to observe and control, without the need for additional equipment, when the suspension appeared as the endpoint of the titration.

Figure 13:
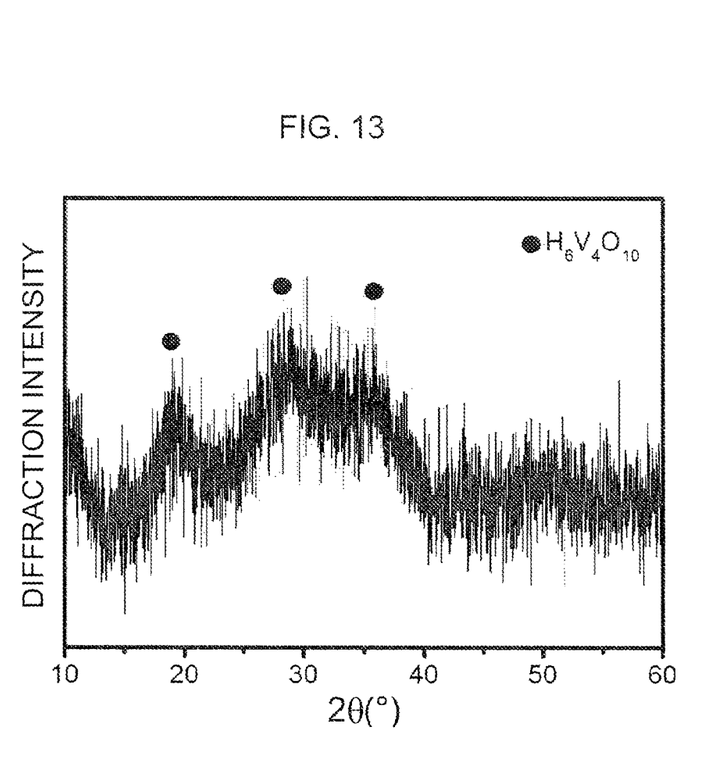
FIG. 13 illustrates XRD patterns of intermediate solid vanadium dioxide powder suspension.

After titration with alkaline reagent, the suspension was filtered to obtain a solid dry suspension, and was measured using X-ray diffraction. As shown in FIG. 13, the suspension obtained from the alkaline treatment had a chemical composition of $V_4H_6O_{10}$. The obtained suspension from above was transferred to a hydrothermal reaction autoclave. The vanadium dioxide powders can be prepared by hydrothermal reaction, drying, and separating.

In the present invention, the doped vanadium dioxide powder can be prepared through hydrothermal reaction of an aqueous solution of vanadium ions and a dopant together. Predetermined dopants were the oxide of the element M, and M can be near V in the Periodic Table with an atomic number of 21-30, such as scandium, titanium, chromium, manganese, iron, cobalt, nickel and copper. M can be Zn and Sn or near them in the Periodic Table such as indium, antimony, gallium, germanium, lead, and bismuth. The doping element M can be a single element or any combination of the above elements. Thus, it should be understood that the dopant M oxides may be a single oxide, and also two or more than two of the oxides of the doping elements, and also a mixture of different doping element oxides. In the present invention, the size and morphology of the resulting doped vanadium dioxide powders can be controlled by the doping element. The molar ratio of the doping elements and $V^{4+}$ ions in the aqueous solution can be determined according to the amount of the dopant element. In the present invention, the ratio ranged from 1:1000 to 1:1, preferably from 3:97 to 3:7, more preferably from 3:97 to 1:9, in addition, the ratio ranging from 1:199 to 1:39 was preferred.

The hydrothermal reaction temperature can range from 200 to 400° C., preferably from 200 to 350° C., more preferably from 250 to 300° C. Within these temperature ranges, the higher the temperature, the more easily the rutile phase vanadium dioxide was prepared. The hydrothermal reaction time could range from 1 to 240 h, preferably from 2 to 120 h, more preferably from 4 to 60 h, and the reaction time can be adjusted with the reaction temperature. Those skilled in the field can select a suitable reaction vessel according to the packing ratio. Usually the packing ratio of hydrothermal reaction may be from 20 to 90%, preferably from 30 to 80%, more preferably 50 to 80%.

Hydrothermal reaction products were separated and dried by centrifugal drying, but it should be understood that the products were also separated by freeze-drying, and other methods.

The powders prepared in the invention had a single chemical composition with the expression of $V_{1-x}M_xO_2$, and wherein x satisfied $0<x\leq0.5$, preferably $0.03<x\leq0.3$, more preferably, $0.03<x\leq0.1$ or $0.005\leq x\leq0.025$. M was a doping element. The crystalline phases of the nanoparticles were determined by X-ray diffraction (XRD, Model D/Max 2550 V, Cu Kα, λ=0.15406 nm, 4°/min, Rigaku, Japan), and the patterns showed than the powders belonged to $VO_2(M)$. The morphology was determined by transmission electron micros-copy (TEM, JEM-2010F, JEOL, Tokyo, Japan) and the results showed that the doped powders were comprised of granulated particles with the size of 10-100 nm.

Figure 3:
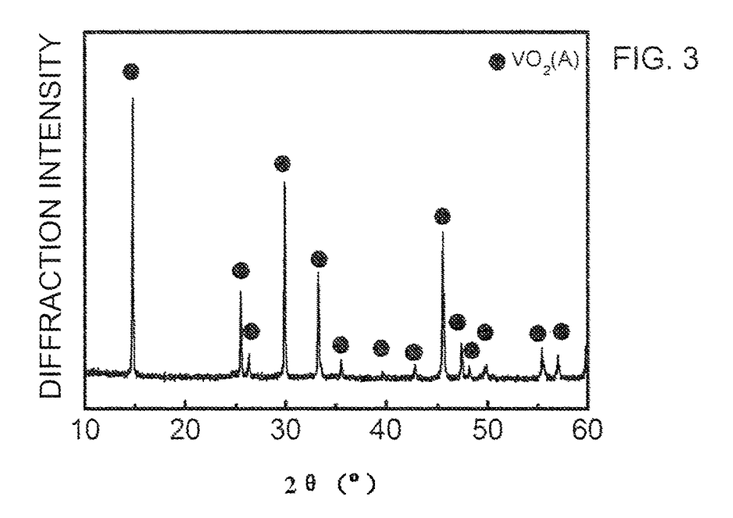
FIG. 3 illustrates XRD patterns of $VO_2$ powders from example 1.
Figure 4:
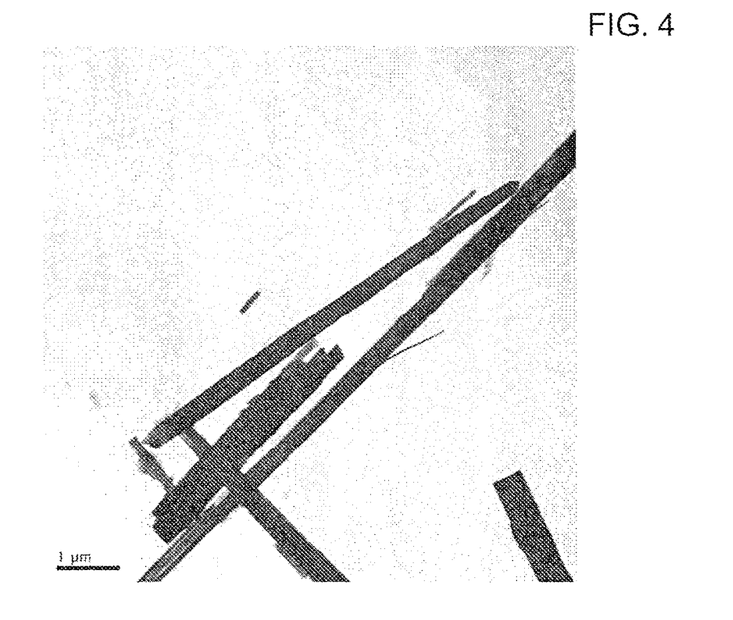
FIG. 4 illustrates TEM images of $VO_2$ powders from example 1.

The method of the invention also can be used to prepare undoped powders with the formula of $VO_2$. The XRD pattern in FIG. 3 (the horizontal ordinate is 2θ degree, the vertical ordinate is the intensity of the diffraction peak) showed that the undoped powders belonged to $VO_2(A)$. The TEM photographs (FIG. 4) showed the powders were comprised of long rod single crystals with lengths of hundreds of nm to dozens of um and widths of hundreds of nm.

Figure 5:
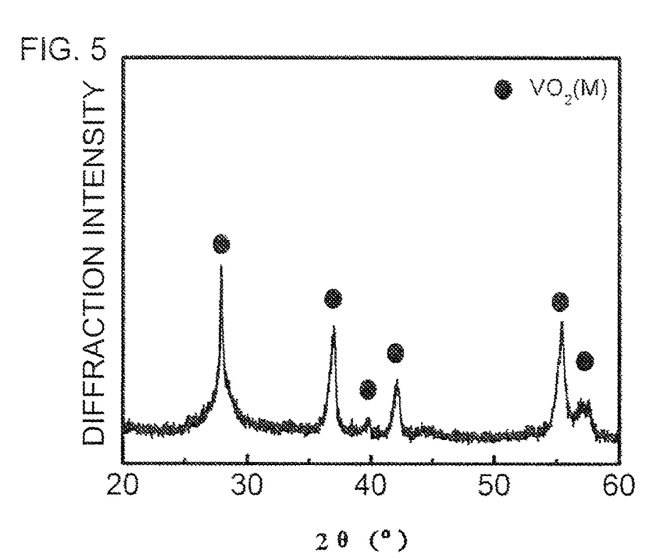
FIG. 5 illustrates XRD patterns of $VO_2$ powders from example 2.
Figure 6:
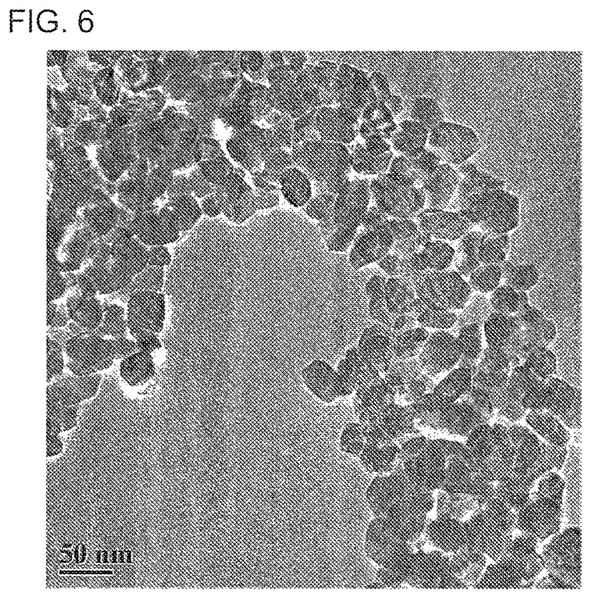
FIG. 6 illustrates TEM images of $VO_2$ powders from example 2.
Figure 12:
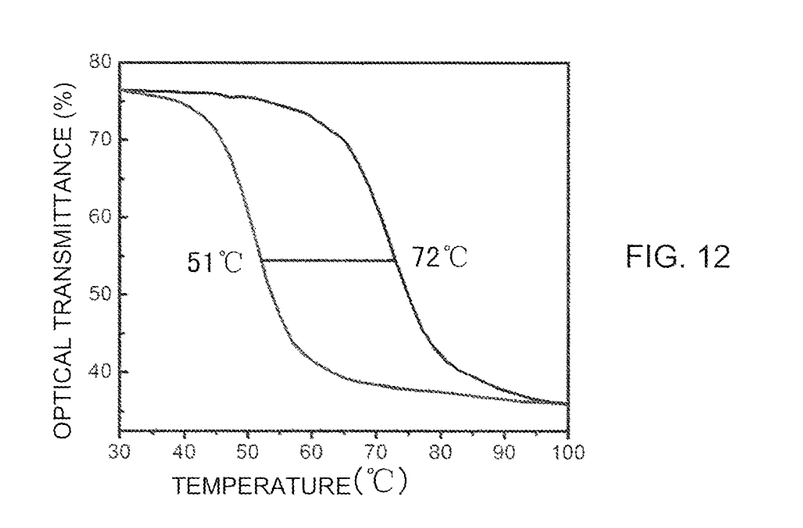
FIG. 12 illustrates temperature dependence of the optical transmittance of the film fabricated with $VO_2$ powders at a fixed wavelength of 2000 nm.

The optical properties of the energy saving films prepared with the doped $VO_2$ powders were comparable to that prepared by sputtering and chemical coating methods. The XRD pattern in FIG. 3 (the horizontal ordinate is 2θ degree, the vertical ordinate is the intensity of the diffraction peak) showed that the undoped powders belonged to $VO_2(A)$. The TEM photographs (FIG. 4) showed the powders were comprised of long rod single crystal with length of hundreds of nm to dozens of um and width of hundreds of nm. However, as was shown in FIG. 5 (the XRD pattern of one undoped $VO_2$ example) and FIG. 6 (the TEM photographs of one undoped $VO_2$ example), the undoped powders were comprised of uniform particles of 50 nm, and the aspect ratio of the particles was 2:1. The powder belonged to $VO_2(M)$. As a result, in comparison with undoped $VO_2$ powders, the morphology and size of the powders were controlled through doping of unique element, and the prepared powders had advantages of small grain size, uniform diameter, and stable crystal structure. Furthermore, the powders can be dispersed well in $H_2O$ and dispersant such as PVP. The concentration was in the range of 0.1-100 g/L. The prepared suspension was easily coated on the substrate of glass and applicable to preparing films and coatings of $VO_2$. The $VO_2$ dispersion was prepared as follows: the powders was added to distilled water with addition of dispersant such as PVP to form a slurry, then the slurry was stirred and ultrasonicated for 30-60 min. The powders disperse well in $H_2O$ and dispersant. The prepared suspension was coated on the substrate of glass and was dried to form $VO_2$ films. FIG. 12 shows the $VO_2$ films with uniform thickness. It is noted that the dispersion can be coated on other substrates such as plastic, silicon wafer and metal, and these coated substrates can be used in construction and travel applications for energy savings.

Figure 11:
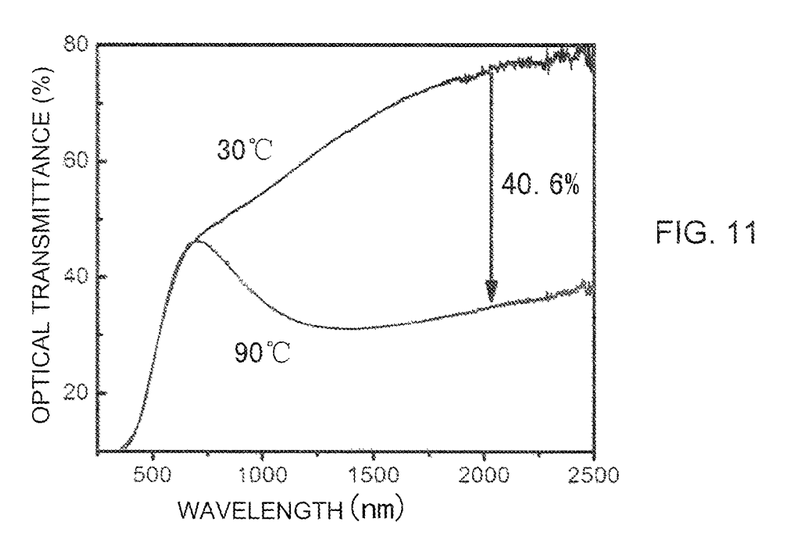
FIG. 11 illustrates optical spectra of film fabricated with $VO_2$ powders before and after phase transition.

The $VO_2$ spectral curve before and after the phase transition were obtained through using a UV-vis-NIR spectrophotometer, Hitachi Corp., Model UV-4100 with temperature control unit at temperatures of 25 and 90° C., respectively. In FIG. 11, a great change in doped $VO_2$ optical transmittance occurred before and after the phase transition, for example, the optical transmittance difference of 40.6% found at 2000 nm wavelength. The hysteresis loops were obtained by measuring the prepared film transmittance at 2000 nm with heating and cooling. In FIG. 12, it is found that the doped $VO_2$ films had phase change properties and the transmittance after phase transition decreased dramatically. The results showed that the optical properties of the $VO_2$ powders prepared by the invention were comparable to that prepared by sputtering and chemical coating methods.

It is noted that the detailed method above in the invention and the examples below were used to explained the invention but are not limited the scope. The raw materials used, and the reagents can be obtained through the purchase of commercially available starting materials or synthesized by conventional chemical method. The following examples, not including the detailed steps, were implemented according to conventional conditions such as described in Beilstein organic chemistry Manual (Chemical Industry Press, 1996) or the advice given by manufacturers. The ratios and percentages, except where described otherwise, were based on the molar mass. In addition, any methods and materials similar or equivalent with the contents can be applied to the method of the present invention. Other aspects of the present invention coming from the disclosure of this article are easily understandable for the skilled person.

The following examples give a detailed description of the invention.

Figure 1:
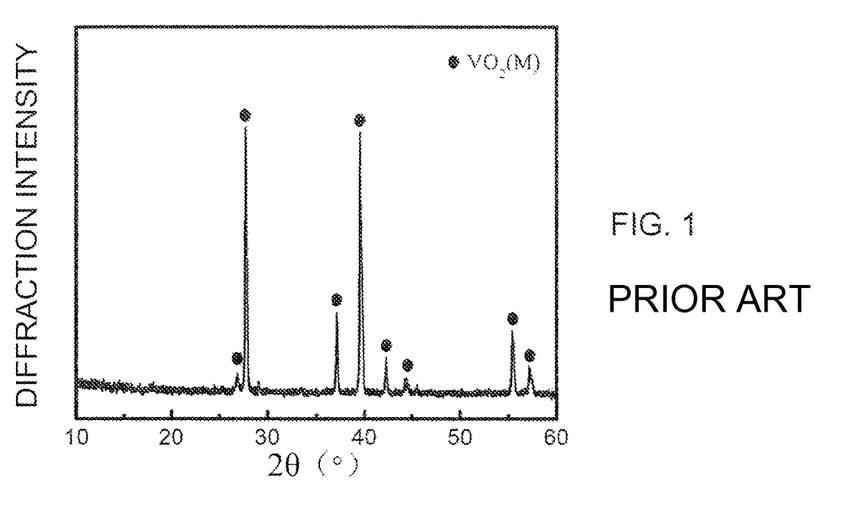
FIG. 1 illustrates example XRD patterns of $VO_2$ powders.
Figure 2:
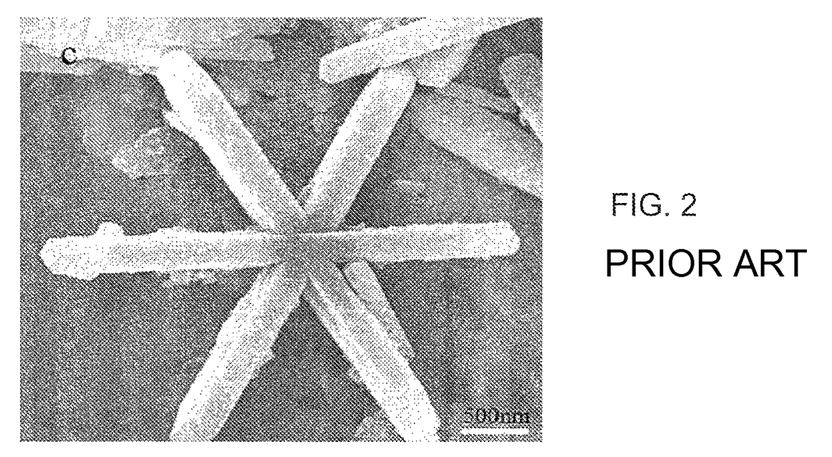
FIG. 2 illustrates example TEM images of $VO_2$ powders.

Comparative Example 0.225 g $V_2O_5$ powders were added to 50 mL, 0.015 mol/L $H_2C_2O_4$ solution while stirring for 10 min and transferred to an autoclave and added 26 mg tungstic acid followed by hydrothermal treatment at 240° C. for 7 days. Then the $VO_2$ powders were obtained through centrifugation and drying. The yield of the powders with a formula of $V_{0.96}W_{0.04}O_2$ is 75%. As is shown in FIG. 1 and FIG. 2, the powders belonging to M phase is long rod-like.

Example One 1 g $VOSO_4$ was dissolved in 50 mL deionized water and titrated with 1 mol/L NaOH solution while stirring. After titration, the suspension was transferred into a 50 mL autoclave with 45 mL distilled $H_2O$ followed by hydrothermal treatment at 250° C. for 12 h. Then the powders with a formula of $VO_2$ were obtained through centrifugation and drying and the yield was 90%. As is shown in the XRD pattern (FIG. 3) and TEM photographs (FIG. 4), the powders belonging to A phase are long and rod-like, and the long rod products were single crystals with a length ranging from several nm to a few micrometers and a width of several nanometers.

Example Two 1 g $VOSO_4$ was dissolved in 50 mL deionized water and titrated with 1 mol/L NaOH solution while stirring. After titration, the suspension and 25 mg $Bi_2O_3$ were transferred into a 50 mL autoclave with 45 mL distilled $H_2O$ followed by hydrothermal treatment at 250° C. for 12 h. Then the powders with a formula of $V_{0.983}Bi_{0.017}O_2$ were obtained through centrifugation and drying and the yield was 90%. As is shown in the XRD pattern (FIG. 5) and TEM photographs (FIG. 6), the powders belonging to A phase are granule-like, and the particles with a main size of 40-50 nm and an aspect ratio of less than 2:1 were single crystals.

Example Three

The experiment was conducted according to the description of Example Two with 1 g $VOSO_4$ and 7.5 mg $Bi_2O_3$. The powders with a formula of $V_{0.995}Bi_{0.005}O_2$ were obtained and the yield was 85%. The powders belonged to M phase and the particles with main size of 40-70 nm and aspect ratio of 1:1-3:1 were single crystals.

Example Four

The experiment was conducted according to the description of Example Two with 1 g $VOSO_4$ and 25 mg SnO in place of $Bi_2O_3$. The powders with a formula of $V_{0.962}Sn_{0.038}O_2$ were obtained and the yield was 95%. The powders belonged to M phase and the particles with main size of 30-40 nm and aspect ratio of 1:1-1.5:1 were single crystals.

Example Five

The experiment was conducted according to the description of Example Two with 1 g $VOSO_4$ and 21 mg SnO in place of $Bi_2O_3$. The powders with a formula of $V_{0.975}Sn_{0.025}O_2$ were obtained and the yield was 90%. The powders belonged to M phase and the particles with main size of 40-50 nm and aspect ratio of 1:1-2:1 were single crystals.

Example Six

The experiment was conducted according to the description of Example Two with 1 g $VOSO_4$ and 25 mg $Fe_2O_3$ in place of $Bi_2O_3$. The powders with a formula of $V_{0.953}Fe_{0.047}O_2$ were obtained and the yield was 90%. The powders belonged to M phase and the particles with main size of 40-60 nm and aspect ratio of 1:1-3:1 were single crystal.

Example Seven

The experiment was conducted according to the description of Example Two with 1 g $VOSO_4$ and 55 mg $Fe_2O_3$ in place of $Bi_2O_3$. The powders with a formula of $V_{0.9}Fe_{0.1}O_2$ were obtained and the yield was 80%. The powders belonged to M phase and the particles with main size of 30-40 nm and aspect ratio of 1:1-1.5:1 were single crystals.

Figure 7:
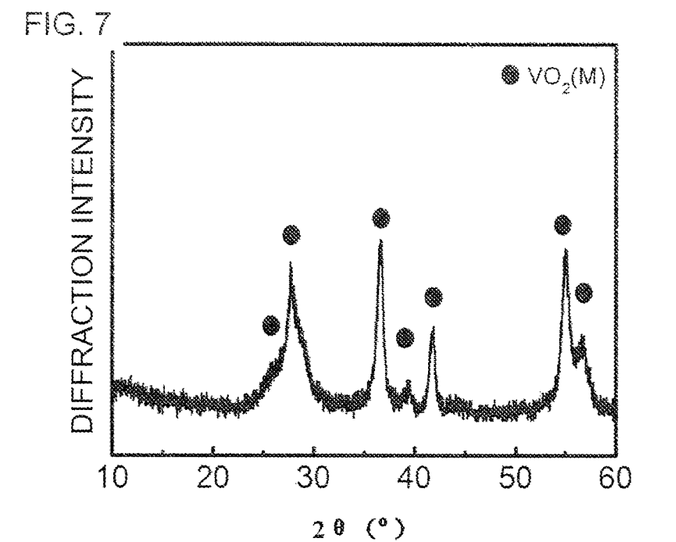
FIG. 7 illustrates XRD patterns of $VO_2$ powders from example 8.
Figure 8:
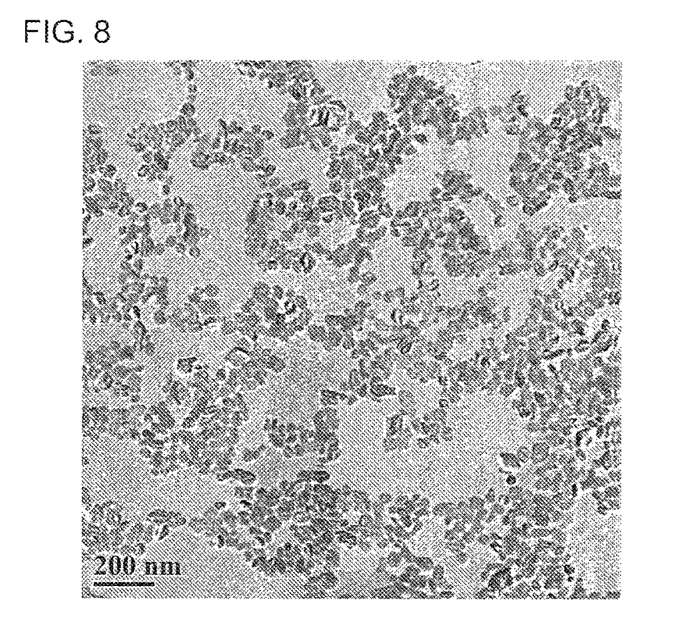
FIG. 8 illustrates TEM images of $VO_2$ powders from example 8.

Example Eight 5 g $VOC_2O_4 \cdot 5H_2O$ was dissolved in 50 mL deionized water and titrated with 0.5 mol/L NaOH solution while stirring. After titration, the suspension and 50 mg ZnO were transferred into 50 mL autoclave followed by hydrothermal treatment at 260° C. for 6 h. Then the powders with a formula of $V_{0.97}Zn_{0.03}O_2$ were obtained through centrifugation and drying and the yield was 90%. As is shown in the XRD pattern (FIG. 7) and TEM photographs (FIG. 8), the powders belonging to M phase are granule-like and the particles with main size of 25-35 nm and aspect ratio of 1:1-1.5:1 were single crystals.

Example Nine

The experiment was conducted according to the description of Example Eight with 5 g $VOC_2O_4 \cdot 5H_2O$ and 550 mg ZnO in place of 50 mg ZnO. The powders with a formula of $V_{0.7}Zn_{0.3}O_2$ were obtained and the yield was 85%. The powders belonged to M phase and the particles with main size of 80-100 nm and aspect ratio of 1:1-3:1 were single crystals.

Example Ten

The experiment was conducted according to the description of Example Eight with 5 g $VOC_2O_4 \cdot 5H_2O$ and 1.65 g ZnO in place of 50 mg ZnO. The powders with a formula of $V_{0.5}Zn_{0.5}O_2$ were obtained and the yield was 80%. The powders belonged to M phase and the particles with main size of 80-100 nm and aspect ratio of 1:1-5:1 were single crystals.

Example Eleven

The experiment was conducted according to the description of Example Eight with the reaction temperature of 300° C. in place of 260° C. The powders with a formula of $V_{0.97}Zn_{0.03}O_2$ were obtained and the yield was 95%. The powders belonged to M phase and the particles with main size of 80-100 nm and aspect ratio of 1:1-2:1 were single crystals.

Figure 9:
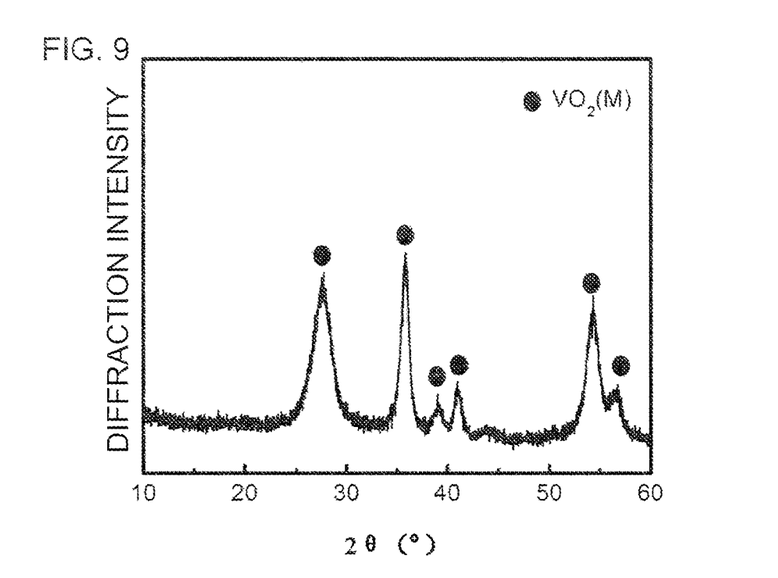
FIG. 9 illustrates XRD patterns of $VO_2$ powders from example 12.
Figure 10:
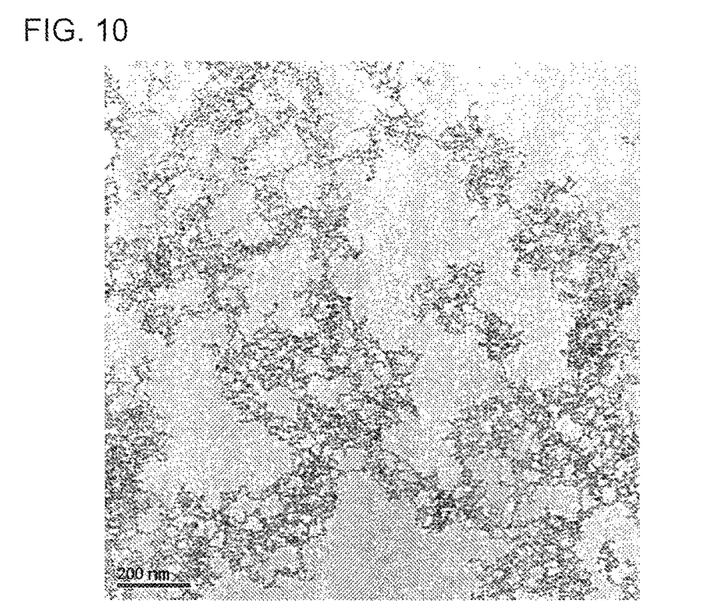
FIG. 10 illustrates TEM images of $VO_2$ powders from example 12.

Example Twelve 0.5 g $VOCl_2$ was dissolved in 50 mL deionized water and titrated with 2 mol/L NaOH solution while stirring. After titration, the suspension and 50 mg $Ti_2O_3$ were transferred into 50 mL autoclave with 35 mL distilled $H_2O$ followed by hydrothermal treatment at 260° C. for 24 h. Then the powders with a formula of $V_{0.84}Ti_{0.16}O_2$ were obtained through centrifugation and drying and the yield was 85%. As is shown of the XRD pattern (FIG. 9) and TEM photographs (FIG. 10), the powders belonging to A phase are granule-like and the particles with main size of 10 nm and aspect ratio of 1:1-1.5:1 were single crystals.

Example Thirteen

The experiment was conducted according to the description of Example Twelve with the reaction time of 36 h in place of 12 h. The powders with a formula of $V_{0.84}Zn_{0.16}O_2$ were obtained and the yield was 95%. The powders belonged to M phase and the particles with main size of 50 nm and aspect ratio of 1:1-3:1 were single crystals.

Example Fourteen

The experiment was conducted according to the description of Example Twelve with 50 mg molybdic acid in place of 50 mg $Ti_2O_3$. The powders with a formula of $V_{0.93}Mo_{0.07}O_2$ were obtained and the yield was 85%. The powders belonged to M phase and long rods with a size of several nm and an aspect ratio of more than 10:1 were single crystals.

Through detection, the dispersibilities of the Comparative Example and Example One were poor, while that of Examples Two through Thirteen were good, especially Examples Two, Four, Five, Seven, Eight, Eleven, and Thirteen.

It is found from the examples above that the doping elements had a vital impact on the size, morphology and crystal form of $VO_2$ powders. A transition accompanied by doping happened in $VO_2$ powders from the initial un-doped micro rod of A phase to nano-granule, while the sizes can be controlled easily. In spite of the description of doped elements of Bi, Sn, Fe, Zn, Ti, Mo, it is noted that the elements near V in Periodic Table, such as the atomic number ranges from 21 to 30, the elements near tin not described in the examples, and even the element W can be used to dope according to the detailed steps above.

0.1 g $VO_2$ powders after grinding prepared according to Example Seven was added to a beaker with 5 mL distilled $H_2O$ while stirring. Then 0.25 g PVP K-30 was added to the suspension. The dispersed solution formed after stirring for 30 min and ultrasonication of 60 min.

To obtain the $VO_2$ thin films, the dispersion was coated on a glass substrate by spin coating, then dried at room temperature or in an oven.

As was shown in FIG. 11 and FIG. 12 the optical properties, especially the properties of infrared solar control, of the $VO_2$ powders prepared by the invention were comparable to that prepared by sputtering and chemical coating method.

Industrial applicability: the $VO_2$ powders and dispersion described in the invention can be applied to energy saving and emission reduction equipment, such as energy saving films, energy saving coatings and solar control equipment, or to energy information devices such as micro-optical switching devices, thermistors, battery materials, and optical information storage devices. The method of preparation of $VO_2$ powder of the invention is simple, low cost, high yield, suitable for mass production.

We claim:

1. A hydrothermal method for preparing a doped vanadium dioxide powder, the method comprising:

a step of titrating a quadrivalent vanadium aqueous solution having a $V^{4+}$ ion concentration between 0.005 and 0.5 mol/L with a basic reagent selected from the group consisting of ammonia, sodium hydroxide, potassium hydroxide, soda ash, sodium bicarbonate, potassium carbonate solution, potassium bicarbonate and combinations thereof, and at a mole ratio of the basic reagent to the quadrivalent vanadium ion $V^{4+}$ aqueous solution from 1:50 to 10:1, to obtain a precursor suspension having a chemical composition of $V_4H_6O_{10}$;

a step of mixing the precursor suspension with a doping agent in a hydrothermal reactor; and a step of a hydrothermal reaction to obtain the doped vanadium oxide powder, wherein:

the doped vanadium oxide powder has a chemical composition of $V_{1-x}M_xO_2$, $0<X\leq0.5$, wherein M is a doping element selected from a group consisting of manganese, iron, cobalt, nickel, copper, zinc, tin, indium, antimony, gallium, germanium, lead and bismuth, the doped vanadium oxide powder is in particle form of particles that have an aspect ratio of 1:1-10:1, and the particles have a particle size of no more than 100 nm in at least one dimension.

2. The method of claim 1, wherein the mole ratio of the basic reagent to the quadrivalent vanadium aqueous solution is 1:5 to 2:1.

3. The method of claim 1, wherein a mole ratio of the doping element to the quadrivalent vanadium aqueous solution is 1:1000 to 1:1.

4. The method of claim 1, further comprising a process of preparing a quadrivalent vanadium aqueous solution.

5. The method of claim 4, further comprising a process of dissolving a soluble raw material into water, the soluble raw material including trivalent, quadrivalent, or pentavalent vanadic salts.

6. The method of claim 4, further comprising a step of oxidization, reduction or dissolving pretreatment of insoluble vanadium raw material, the insoluble vanadium raw material including metal vanadium, vanadium oxides or their mixture.

7. The method of claim 1, wherein a packing ratio of the hydrothermal reactor is 20%-90%, a reaction temperature is 200-400° C. and a holding time is 1-240 h.

8. The method of claim 7, wherein the holding time is 2-120 h.

9. The method of claim 7, wherein the packing ratio is 30-80%.

10. The method of claim 7, wherein the holding time is 4-60 h.

* * * * *